United States Patent
Adal

Patent Number: 5,825,239
Date of Patent: Oct. 20, 1998

[54] PEAK DETECTOR FOR AUTOMATIC GAIN CONTROL

[75] Inventor: Zubir Adal, Santa Ana, Calif.

[73] Assignee: Texas Instruments Incorporated, Dallas, Tex.

[21] Appl. No.: 852,247

[22] Filed: May 6, 1997

[51] Int. Cl.[6] .................................. G06G 7/12; H03L 5/00

[52] U.S. Cl. .......................... 327/563; 327/331; 327/332; 330/134; 330/279

[58] Field of Search ..................................... 327/560–563, 327/331, 332, 334, 321, 323; 330/134, 129, 279

[56] References Cited

U.S. PATENT DOCUMENTS

| 4,398,153 | 8/1983 | Rittenbach | 327/119 |
| 5,051,707 | 9/1991 | Fujita | 330/279 |
| 5,220,468 | 6/1993 | Sidman | 327/332 |
| 5,350,908 | 9/1994 | Bechtel | 327/332 |
| 5,416,437 | 5/1995 | Contreras et al. | 327/536 |
| 5,422,601 | 6/1995 | Kovacs et al. | 330/134 |
| 5,606,285 | 2/1997 | Wang et al. | 330/134 |

Primary Examiner—Toan Tran
Attorney, Agent, or Firm—W. Daniel Swayze, Jr.; Wade James Brady, III; Richard L. Donaldson

[57] ABSTRACT

The present invention includes a variable gain amplifier to output two differential signals which are level shifted and compared through two comparators to drive a charge pump which produces either a discharge current or a charge current to provide feedback control to the variable gain amplifier.

8 Claims, 5 Drawing Sheets

PEAK DETECTOR FOR AUTOMATIC GAIN CONTROL

FIELD OF THE INVENTION

The present invention relates to automatic gain control (AGC) circuits and more particularly to automatic gain control circuits having feedback control with charge pump circuits.

BACKGROUND OF THE INVENTION

AGC circuits are used to provide an output of constant amplitude from an input of varying amplitude. AGCs provide this constant output by providing a gain inversely proportional to the input amplitude. Thus, if the input amplitude is decreased, the AGC circuits provide more gain to maintain constant output amplitude. If the input amplitude is increased, the AGC circuits provide less gain to maintain constant output amplitude.

AGCs are useful for many applications. One example involves the reading of data from the disk drive. Information on the disk drive may have been recorded at different recording levels or variations may exist across the media. As a result, signals read from the disk drive may differ in amplitude. To ensure a proper reading of signals of different amplitude, the AGC may be used to adjust the signal to a desired amplitude. For this example, the AGC circuit could receive its input signals from a preamplifier connect to a head of the disk drive.

A typical AGC circuit includes a charge pump, a capacitor, a full wave rectifier and voltage controlled amplifier. The voltage controlled amplifier receives an input signal, amplifies this input signal by the amount determined by control voltage input and produces an amplified output. The amplified output is used to control the charge pump. The charge pump is coupled to the capacitor and charges/discharges the capacitor, thus changing the voltage across the capacitor. The capacitor is coupled to the control voltage input of the voltage controlled amplifier. As the voltage across the capacitor changes, the control voltage input of the voltage controlled amplifier changes, resulting in a change in the gain of the voltage controlled amplifier. Thus, a change in the signal at the input of the charge pump can change the gain of the voltage controlled amplifier. Since the input of the charge pump is controlled by the output of the voltage controlled amplifier, a loop is formed where a change in the output of the amplifier can result in a change in the gain of the amplifier.

An AGC circuit is typically used to maintain a signal within a limited amplitude range. When the amplitude of the output of the voltage controlled amplifier exceeds an upper limit of the desired range, the charge pump moves charge in or out of the capacitor to change the voltage of the control voltage input of the voltage controlled amplifier and reduces its gain. By reducing the amplifier gain, the amplitude of the output of the voltage controlled amplifier will be decreased until it's within the desired range. However, this type of system is not free from problems, one problem is bandwidth of the AGC system. Returning to the example of the reading data from the disk drive, if the data is recorded at a high frequency, the ability of the loop to provide accurate response to changes in gain may not be sufficient.

The bandwidth may be limited by circuit elements in the loop. One such element used in the loop of the AGC system is a full wave rectifier. Usually, this full wave rectifier has a closed loop system which limits the bandwidth of the full wave rectifier. As illustrated in FIG. 1, an AGC system is shown with input differential signals, namely voltage signals $V_{ia}$ and $V_{iab}$, being read from; for example, a magnetic disk (not shown). These signals are input to the variable gain amplifier 100 (VGA). Output from the VGA 100 is a pair of differential voltage signals $V_{Oab}$ and $V_{Oa}$. These two voltage signals $V_{oab}$ and $V_{oa}$ are illustrated in FIG. 2 and are input to a filter 110, which may be a seven pole, low pass filter. The two signals are filtered, and the output signals from the filter 110 serve as inputs to an amplifier 120; for example, which may have a gain of 14. The output voltages $V_{dp}$ and $V_{dn}$, which are illustrated in FIG. 3, are output from the amplifier 120. These two signals $V_{dp}$ and $V_{dn}$ are input to a full wave rectifier 130. The output of the full wave rectifier 130 is illustrated in FIG. 4 a voltage signal $V_{fwro}$. The output of the full wave rectifier 130 is compared with a reference voltage, for example, the voltage signal $V_{AGODAC}$. The comparator 140 compares the voltage signal $V_{fwro}$ with the reference voltage signal $V_{AGODAC}$ to output a digital signal $V_{cp}$. The output of comparator 140 controls a charge pump 150, to output an attack current $I_{ATTACK}$ if the output of the comparator is positive and controls the charge pump 150 to output a decay current $I_{DECAY}$ if the output of the comparator is zero. Thus, by measuring the output of the variable gain amplifier 100 and controlling the attack current and the decay current from the charge pump 150, the voltage on the capacitor 160 is either increased or decreased in voltage which results in the change in the corresponding amplitude of the output of the VGA 100. Thus, the feedback scheme described above controls the output of the VGA 100. However, the above circuit of FIG. 1 suffers from bandwidth limitations. Furthermore, the above circuit suffers from the lack of precision of the voltages $V_{dp}$ and $V_{dn}$ which depends on the DC reference voltage, $V_{ref}$ and the gain of the full wave rectifier 100. If this system is implemented in a closed loop gilbert cell type configuration for a 200 Mb/S channel with an 8/9 code, the operating frequency is around 56 MHz. This implies that the flat band area of the full wave rectifier should be close to this 56 MHz. This is very difficult to achieve. Additionally, the full wave rectifier suffers from slew rate limitations and process variation of full wave rectifier pole-zero compensation, both of which worsen the accuracy of the full wave rectifier gain at high frequencies. Consequently, these problems with the full wave rectifier result in unsatisfactory gain control of the AGC circuit.

SUMMARY OF THE INVENTION

The present invention eliminates a full wave rectifier in the feedback loop of a automatic gain control system by use of a peak detector. The present invention uses the fact that the output of the filter is differential, including both a positive and negative signals to achieve an AGC system that has a high bandwidth. Both the positive and the negative signals are shifted down by a fixed d.c. voltage, namely $V_{ref}$. This $V_{ref}$ may be programmable to different levels of voltage and determines the output amplitude of the automatic gain control by setting the period of time that the charge pump operates. The positive signal is compared with a negative shifted signal which has been shifted by the reference voltage. This detects the peak of one half of the cycle. Additionally, the negative signal is compared with a positive shifted signal, which has been shifted by the same reference voltage. Again, this detects the peak of the other half of the cycle. This peak detection by the peak detector circuit is used to control the charge pump and thus control the AGC circuit.

The present invention uses an emitter follower circuit which operates at a very high bandwidth to achieve the signal shifting in the peak detector. Furthermore, a feed forward capacitor can be added to this level shifter to minimize any delay in the signal shifting.

Furthermore, the present invention uses a switching comparator scheme in order to reduce mismatch in comparator section of the feedback loop. The present invention achieves constant AGC output levels up to frequencies of 100 MHz or around 356 MB/S data rate for 8/9 coding.

DETAILED DESCRIPTION OF THE INVENTION

The present invention illustrates a automatic gain control (AGC) circuit to operate at a very high frequency without using a full wave rectifier in the feedback circuit. This circuit eliminates the limitations due to bandwidth of the FWR and the limitations due to the slew rate of the FWR.

Furthermore, there is no need to compensate for process variations of the FWR pole-zero compensation.

In contrast with the prior art AGC circuits, the present invention provides a bandwidth that provides a constant automatic gain control system for frequencies up to 100 MHz, or if 8/9 coding is used up to 356 MB/S data rate.

The present invention replaces the full wave rectifier with a peak detector which includes an emitter follower circuit which can operate at a high bandwidth. Additionally, the emitter follower circuit has a feed forward capacitor to eliminate any delay in the emitter follower circuit as it is operating as a level shifter or signal shifter.

The present invention uses the output of two comparators in order to control a charge pump. In a alternate embodiment, a switching scheme is employed to utilize a single comparator which eliminates the need for redundancy of the comparator and a logical operation.

Figure 1:
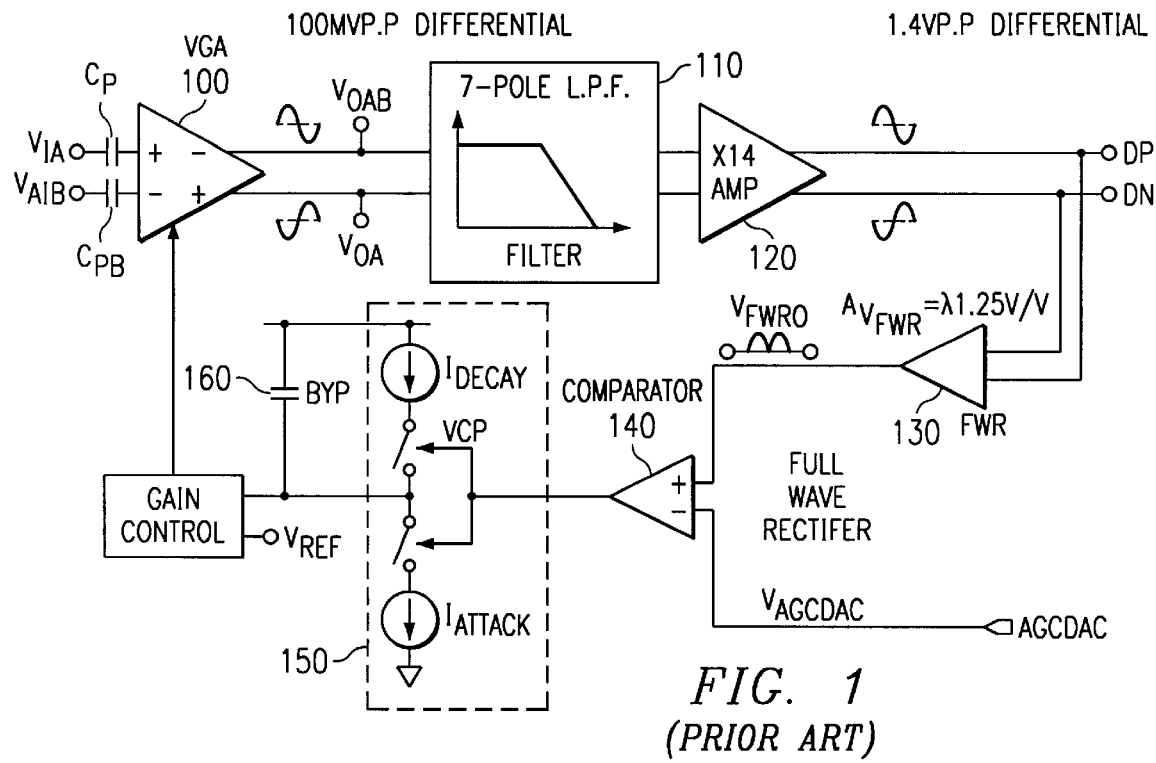
FIG. 1 illustrates a block circuit diagram.
Figure 2:
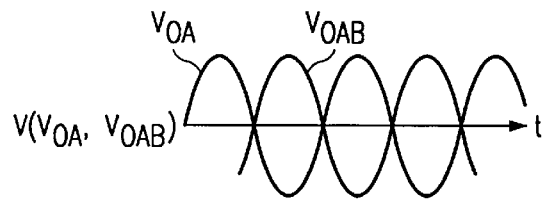
FIG. 2 illustrates a waveform diagram of the circuit of FIG. 1.
Figure 3:
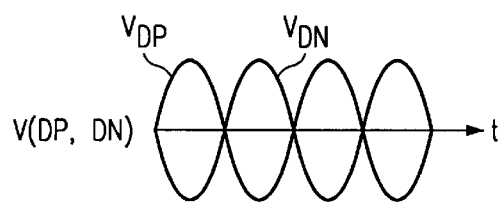
FIG. 3 illustrates another waveform diagram of the circuit of FIG. 1.
Figure 4:
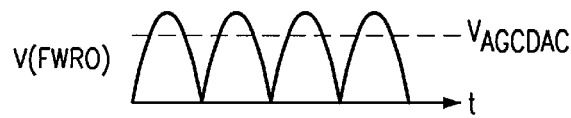
FIG. 4 illustrates a waveform diagram of a rectified signal of the circuit of FIG. 1.
Figure 5:
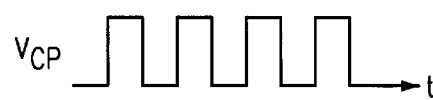
FIG. 5 illustrates a digital waveform diagram of the circuit of FIG. 1.
Figure 6:
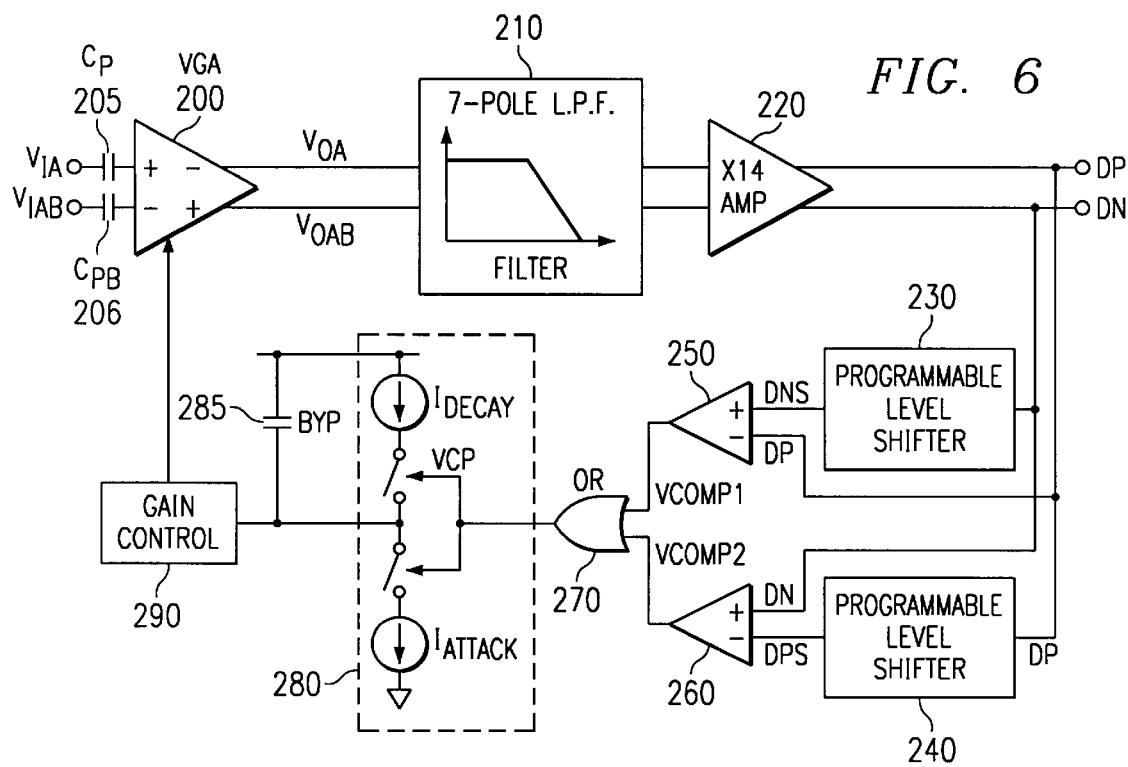
FIG. 6 illustrates a block circuit diagram of the present invention.

FIG. 6 illustrates a block diagram of an embodiment of the present invention. Two signals, $V_{ia}$ and $V_{iab}$, are input to capacitors 205 and 206, respectively. These capacitors eliminate noise from signals $V_{ia}$ and $V_{iab}$ respectively. The output of the two capacitors 205 and 206 is input to variable gain amplifier 200. The gain or amount the respective signals $V_{ia}$ and $V_{iab}$ are amplified depend on the gain setting which has been set by a signal from gain control 290. The output of variable gain amplifier 200 is voltage signals $V_{Oa}$ and $V_{Oab}$. These voltage signals, $V_{Oa}$ and $V_{Oab}$, are input to filter 210, which may be a seven pole low pass filter. The output of the filter 210 is input to amplifier 220, which amplifies the signal to output voltage signals $V_{dp}$ and $V_{dn}$.

Figure 7:
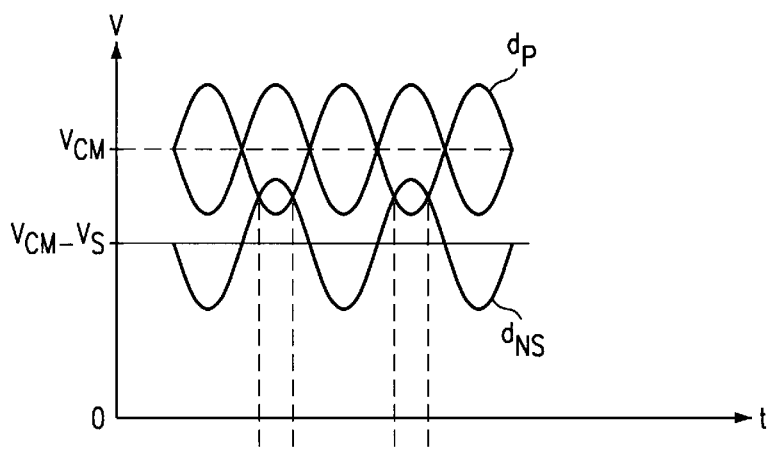
FIG. 7 illustrates a waveform diagram of the present invention.

FIG. 7 illustrates the wave form of these two output voltage signals $V_{dp}$ and $V_{dns}$. The voltage, where $V_{dns}$ is the voltage shifted signal of $V_{dn}$. The voltage signal $V_{dp}$ and the voltage signal $V_{dn}$ are input to programmable level shifter 230 and programmable level shifter 240, respectively. The programmable level shifter 230 level shifts the level of voltage signal $V_{dn}$ to generate voltage signal $V_{dns}$. One circuit to perform the level shifting is an adder circuit to add or subtract the voltage signal $V_{dn}$ by the reference voltage. The programmable level shifter 230 can change the reference voltage so that the amount of level shifting may vary. The output of the programmable level shifter 230 is $V_{dns}$. Similarly, the voltage signal $V_{dp}$ is input to the programmable level shifter 240 to shift the level of the voltage signal $V_{dp}$ by a predetermined amount; for example, a reference voltage. The programmable level shifter 240 operates in a similar fashion to the programmable level shifter 230.

The comparator 250 inputs at the plus input, the $V_{dns}$ and at the negative input the voltage signal $V_{dp}$. The comparator 250 outputs a compared voltage $V_{comp1}$. Additionally, the comparator 260 inputs at the plus input, the voltage signal $V_{dn}$ and at the negative input, the voltage signal $V_{dps}$. The comparator outputs the signal $V_{comp2}$ based upon the comparison within the comparator. These two voltages namely, $V_{comp1}$ and $V_{comp2}$ are input to a logical OR gate whose output is logical "or" of $V_{comp1}$ and $V_{comp2}$.

Figure 8:
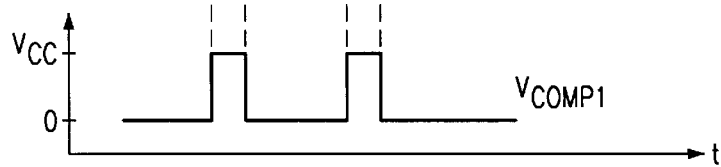
FIG. 8 illustrates a digital waveform diagram of the present invention.

FIG. 8 illustrates $V_{comp1}$. As illustrated in FIG. 8, a series of pulses is generated by the comparator 250 with the width of each pulse corresponding to the period of time of the overlap between $V_{dp}$ and $V_{dns}$ as illustrated in FIG. 7.

Figure 9:
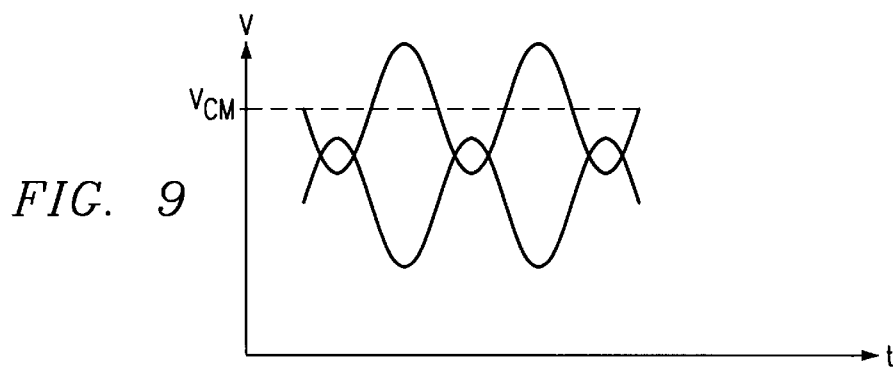
FIG. 9 illustrates another waveform diagram of the present invention.

FIG. 9 illustrates the voltage signals $V_{dn}$ and the shifted positive voltage signal $V_{dps}$.

Figure 10:
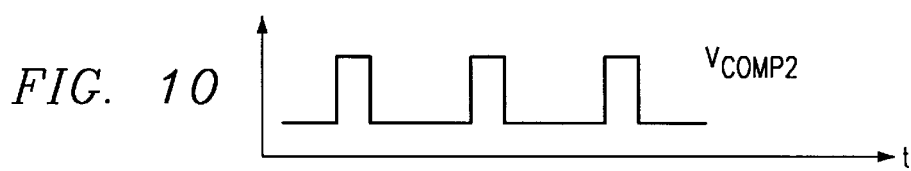
FIG. 10 illustrates another digital waveform diagram of the present invention.
Figure 11:
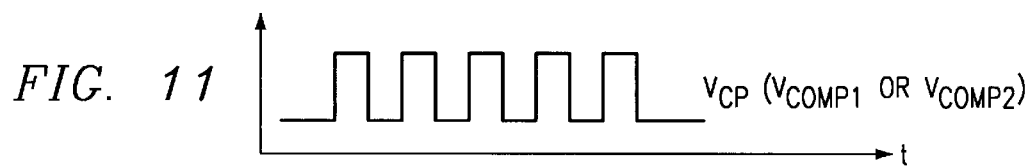
FIG. 11 illustrates another digital waveform diagram of the present invention.

FIG. 10 illustrates the output of comparator 260, signal $V_{comp2}$, which is a series of pulses. The width of each of these pulses correspond to the time period when shifted voltage signal $V_{dps}$ is greater than voltage signal $V_{dn}$. The logical OR circuit 270 combines these pulses from both the comparators 250 and 260 to form a combined series of pulses $V_{cp}$ as illustrated in FIG. 11. The period of time will vary in accordance with the needs of the charge pump circuit 280 to charge the capacitor 285 but may be set at 1/17. The width of the pulse depends on the time period of overlap. The output of the OR circuit 270 controls the charge pump circuit 280. The presence of a pulse results in current flowing to capacitor 285, charging up the capacitor with the attack position current $I_{ATTACK}$ while the lack of a pulse results in the current pump causing a decay current $I_{DECAY}$ or a negative current from the capacitor 285 resulting in a reduced voltage on the capacitor 285. The voltage on the capacitor 285 is input to the gain control circuit 290. This gain control circuit 290 outputs a control signal to the variable gain amplifier 200 based on the relative magnitude of the input voltage from the capacitor 285. As the voltage increases, the variable gain amplifier 200 increases the gain of the signal being input to the variable gain amplifier 200 and, as the voltage on the capacitor is reduced, the variable gain amplifier 200 decreases the gain of the signal being input to the variable gain amplifier 200.

Figure 12:
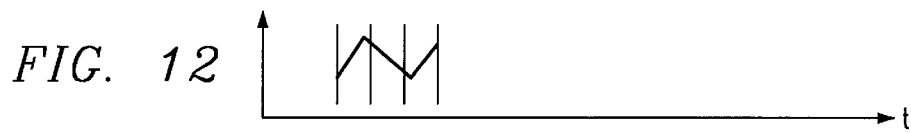
FIG. 12 illustrates another digital waveform diagram of the present invention.

The programmable level shifter 230 and 240 have a bandwidth greater than a frequency of 100 MHz, resulting in frequency independence for the variable gain amplifier 200. In one embodiment, the programmable level shifters could be summing circuits to sum the voltage signal either $V_{dn}$ or $V_{dp}$ or subtract a fixed reference voltage. Each of the level shifters could be independently programmable with different voltages. This would shift the voltage signal $V_{dn}$, by the predetermined voltage as shown in FIG. 12.

FIG. 6 illustrates that capacitors 205 and 206 are coupled to variable gain amplifier 200 which is controlled by control gain circuit 290. The variable gain amplifier 200 is coupled to filter 210 which is in turn coupled to amplifier 220. Amplifier 220 is coupled to comparator 250 and to programmable load shifter 230. Additionally, amplifier 220 is coupled to programmable load shifter 240 and comparator 260. The programmable load shifters 230 and 240 are coupled to comparators 250 and 260. The comparator 250 is coupled to OR gate 270, and the comparator 260 is coupled to OR gate 270. The OR gate 270 is coupled to charge pump 280. The charge pump 280 is coupled to capacitor 285. Both the charge pump 280 and the capacitor 285 are coupled to the gain control circuit 290, which is coupled to the variable gain amplifier 200.

Figure 13:
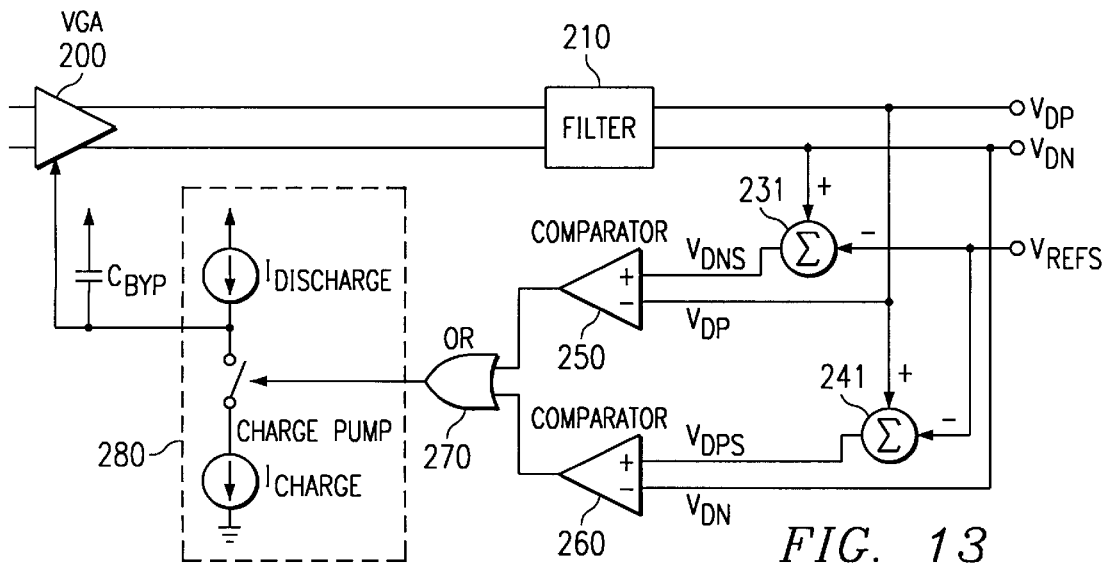
FIG. 13 illustrates another embodiment of the present invention.

FIG. 13 illustrates the use of summation circuits 231 and 241 as the programmable level shifters 230 and 240. This provides an alternate to programmable level shifter.

Figure 14:
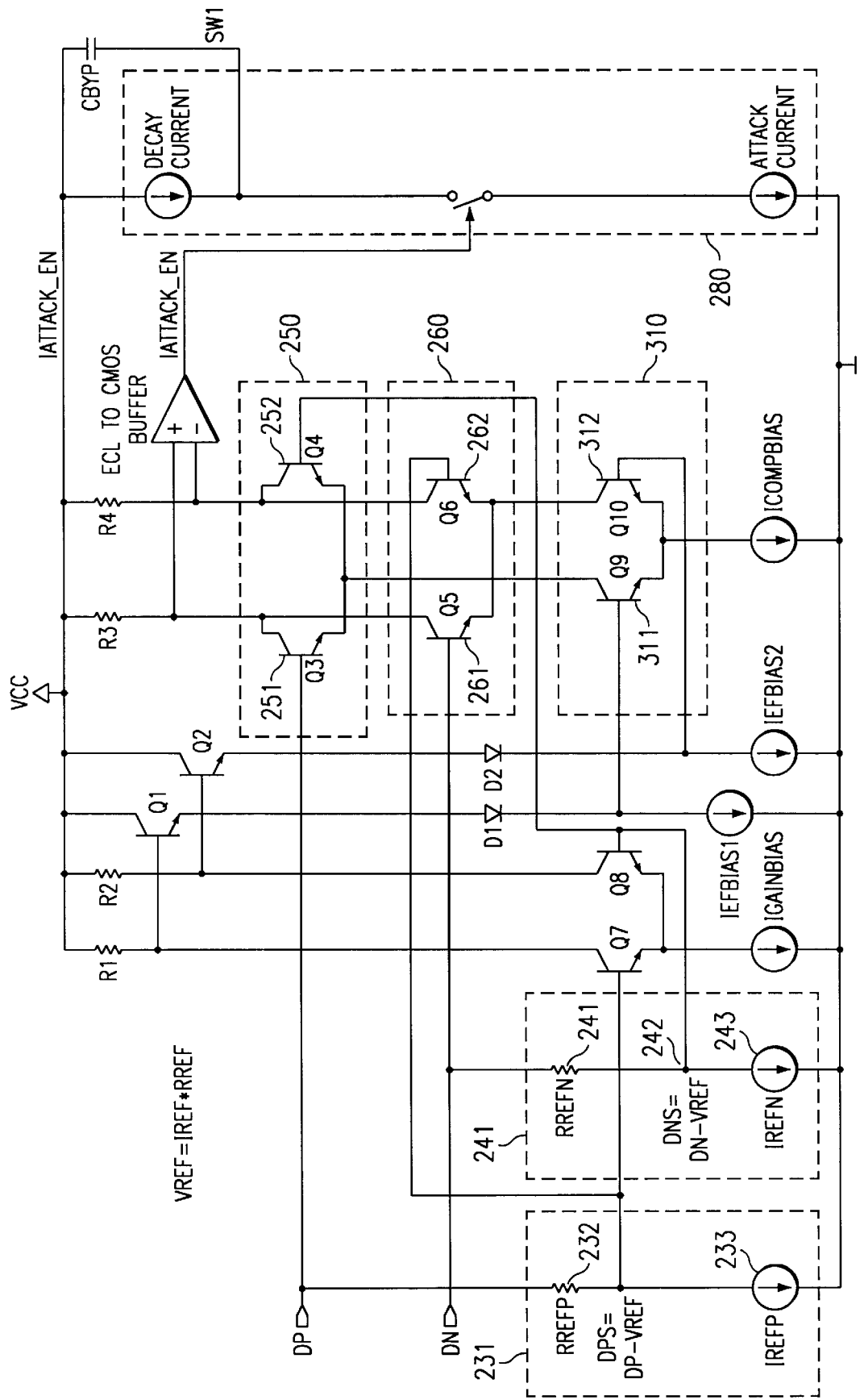
FIG. 14 illustrates another embodiment of the present invention.
Figure 15:
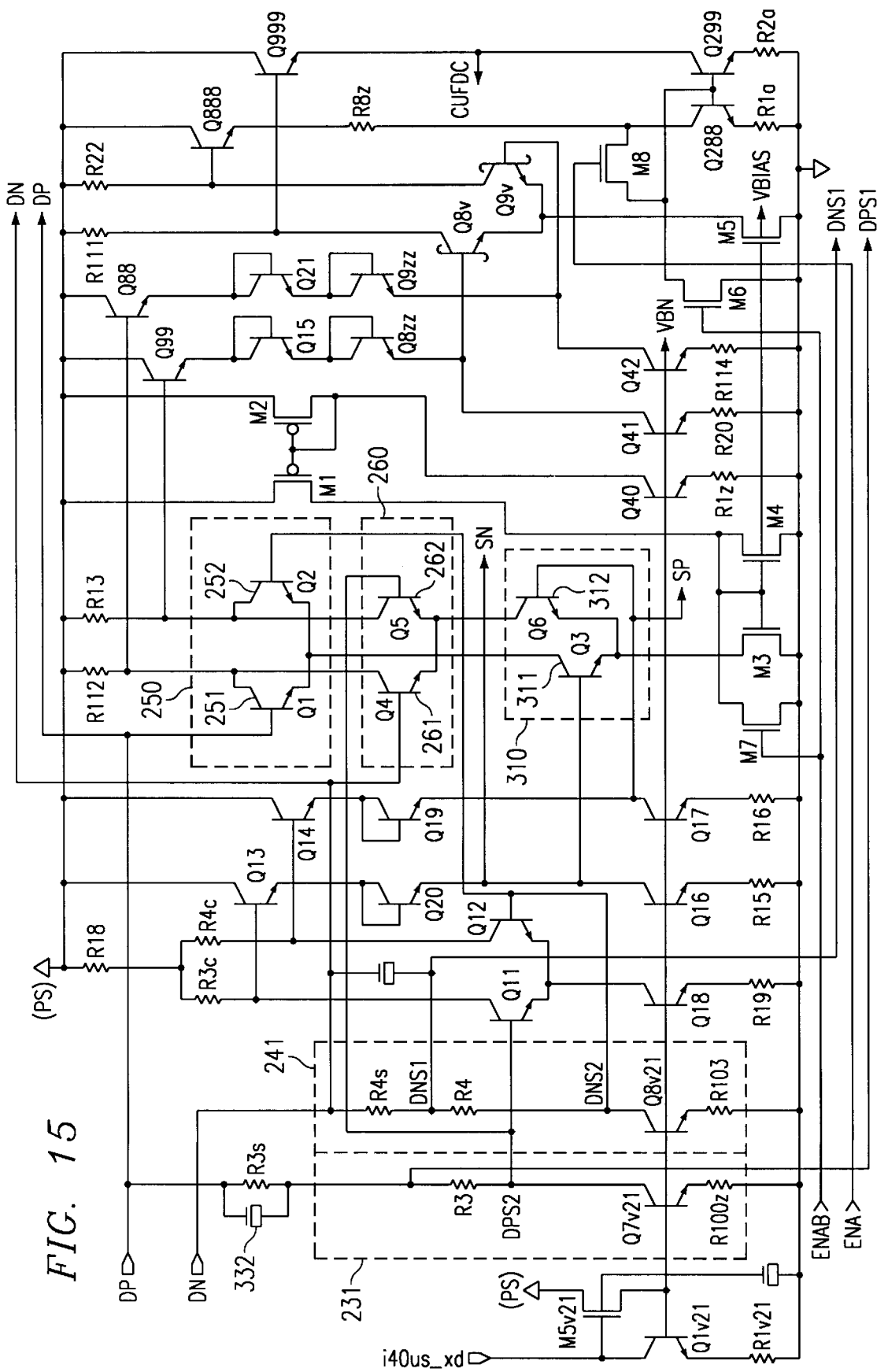
FIG. 15 illustrates another embodiment of the present invention.

FIG. 14 illustrates another embodiment of the present invention.

FIG. 14 illustrates the summation circuits 231 and 241, the comparators 250 and 260 and the charge pump 280. Additionally, FIG. 14 illustrates a selector 310 to select individually either the comparator 250 or 260. The selector 310 includes two transistors 311 and 312, which are individually controlled by a voltage applied to the base of either transistor 311 or 312 to select which comparator is to be activated. Since it is necessary to activate only one comparator at any given time, the selector performs this function. Selection of comparators 250 and 260 is achieved by current steering. When one of the transistors 311 or 312 are activated, the current flows from the emitter to the collector to the emitter of the transistors included within comparators 250 or 260. For example, comparator 250 has transistors 251 and 252 connected through their emitters. The collectors of transistor 251 and 252 are connects of an ECL to CMOS buffer. The bases are connected to $V_{dp}$ and $V_{dns}$ respectively. Thus, when transistor 311 is activated, this activates comparator 250 by current flowing in the emitter through transistor 250 while comparator 260 is inactivated.

Likewise, when transistor 312 is activated, a current flows from the commonly connected emitters of transistors 261 and 262. The voltage $V_{dn}$ is applied to the base of transistor 261 while the voltage $V_{dps}$ is applied to the base of transistor 262. By a current flow from the emitters of transistors 261 and 262 and through transistor 312, comparator 260 is activated to compare $V_{dn}$ to $V_{dps}$.

Summation circuit 231 includes resistor 232 and current source 233. Since the current generated by current source 233 is constant, the voltage across 231 is determined by equation 1.

$$V_{ref}=I_{ref}R_{ref.} \tag{1}$$

Thus, the voltage at node 234 is $V_{dps}$ which equals $V_{dp}-V_{ref}$.

Similarly, with summation circuit 241, a voltage drop across resistor 241 is determined by the current generated by current source 243. Since one end of resistor 241 is connected to the voltage $V_{dn}$, the voltage at terminal 242, $V_{dns}$, is equal to $V_{dn}$ minus $I_{ref}R_{ref.}$ By the use of summation circuits, 231 and 241, the voltage of $V_{dp}$ and $V_{dn}$ respectively are reduced by a fixed amount through by controlling the current generated by current sources 233 and 234 respectively. As shown in FIG. 14, these voltages $V_{dps}$, $V_{dns}$ are used by the comparators 250 and 260. Since it is not necessary to compare either $V_{dp}$ with $V_{dns}$ at the same time as $V_{dn}$ is compared with $V_{dps}$, the comparators 250 and 260 can be selectively disabled and enabled by selection circuit 310.

I claim:

1. A circuit to maintain the gain of a first signal and a second signal, comprising:

an amplifying circuit having a gain to amplify the first signal and the second signal, and a circuit to filter the first signal and the second signal to obtain a first filtered signal and a second filtered signal, a level shifter circuit to shift the level of the first filtered signal and to shift the level of the second filtered signal to obtain a first leveled signal and a second leveled signal;

a circuit to correct the gain of the amplifying circuit based on the first leveled signal and the second leveled signal.

2. A circuit to maintain the gain of the first signal and the second signal as in claim 1, wherein said circuit further comprises a first comparator to compare the first filtered signal with the second leveled signal and a second comparator to compare the first leveled signal with the second filtered signal.

3. A circuit to maintain the gain of the first signal and the second signal as in claim 2, wherein said circuit further comprises an OR circuit to logically OR the output of the first comparator with the output of the second comparator.

4. A circuit to maintain the gain of the first signal and the second signal as in claim 2 wherein said circuit further comprises a selector circuit to only select the output of said first comparator or the output of said second comparator.

5. A method to maintain the gain of a first signal and a second signal, comprising the steps of;

amplifying the first signal and the second signal using and amplifying circuit having a gain;

filtering the first signal and the second signal to obtain a filtered first signal and a filtered second signal;

shifting the level of the filtered first signal and shifting the level of the filtered second signal to obtain a leveled first signal and a leveled second signal; and correcting the gain of the amplifying circuit based on the leveled first signal and the leveled second signal.

6. A method to maintain the gain of the first signal as in claim 1, wherein the method further comprises the step of comparing the filtered first signal with the leveled filtered second signal and comparing the leveled first signal with the second signal.

7. A method to maintain the gain of the second signal as in claim 6 wherein the method further comprises oring the output of the first comparator with the output of the second comparator.

8. A method to maintain the gain of the first signal and the second signal as in claim 6 wherein the method further comprises the step of selecting the output of the first comparator or the output of the second comparator.

* * * * *